US009829522B2

(12) United States Patent
Holzworth et al.

(10) Patent No.: US 9,829,522 B2
(45) Date of Patent: Nov. 28, 2017

(54) METHOD AND APPARATUS FOR TUNING A RESISTANCE AND REACTANCE OF A WIRELESS POWER TRANSMITTER TESTING UNIT

(71) Applicant: QUALCOMM Incorporated, San Diego, CA (US)

(72) Inventors: Joshua Archelaus Holzworth, San Diego, CA (US); Linda Stacey Irish, San Diego, CA (US); Cody Burton Wheeland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 320 days.

(21) Appl. No.: 14/606,867

(22) Filed: Jan. 27, 2015

(65) Prior Publication Data

US 2016/0216301 A1 Jul. 28, 2016

(51) Int. Cl.
| | |
|---|---|
| *G01R 27/16* | (2006.01) |
| *G01R 31/02* | (2006.01) |
| *G01R 31/40* | (2014.01) |
| *H04B 5/00* | (2006.01) |
| *H03H 7/40* | (2006.01) |

(52) U.S. Cl.
CPC .......... *G01R 27/16* (2013.01); *G01R 31/027* (2013.01); *G01R 31/40* (2013.01); *H04B 5/0037* (2013.01); *H03H 7/40* (2013.01)

(58) Field of Classification Search
None
See application file for complete search history.

(56) References Cited

U.S. PATENT DOCUMENTS

| 3,505,588 A | 4/1970 | Elwood |
| 3,927,280 A | 12/1975 | Gupta et al. |

(Continued)

FOREIGN PATENT DOCUMENTS

| EP | 0993115 A2 | 4/2000 |
| WO | WO-2013134573 A1 | 9/2013 |

OTHER PUBLICATIONS

International Search Report and Written Opinion—PCT/US2016/012483—ISA/EPO—dated Mar. 29, 2016.

*Primary Examiner* — Jermele M Hollington
*Assistant Examiner* — Suresh K Rajaputra
(74) *Attorney, Agent, or Firm* — Knobbe, Martens, Olson & Bear, LLP

(57) ABSTRACT

An apparatus for testing an impedance range of a wireless power transmitter is provided. The apparatus comprises an adjustable impedance circuit configurable to be connected to a power source. The apparatus further comprises a transformer coupled the adjustable impedance circuit. The apparatus further comprises a sensing circuit configured to sense a parameter indicative of a parasitic impedance of the adjustable impedance circuit. The apparatus further comprises a driver circuit configured to drive the transformer with a signal based on the sensed parameter that causes the transformer to apply a first voltage to the adjustable impedance circuit. The first voltage has a substantially same amplitude as a voltage drop caused by the parasitic impedance. The second voltage is out of phase with the voltage drop. The sensed parameter is a current circulating in the adjustable impedance circuit or a voltage across at least a portion of the adjustable impedance circuit.

20 Claims, 4 Drawing Sheets

(56) References Cited

U.S. PATENT DOCUMENTS

| | | | |
|---|---|---|---|
| 5,777,475 A | 7/1998 | Vester | |
| 6,525,530 B1* | 2/2003 | Jansson | H04B 5/00 |
| | | | 324/207.16 |
| 8,278,784 B2* | 10/2012 | Cook | H01Q 1/2225 |
| | | | 307/149 |
| 2011/0193416 A1* | 8/2011 | Campanella | H01Q 7/00 |
| | | | 307/104 |
| 2011/0281535 A1* | 11/2011 | Low | H02J 7/025 |
| | | | 455/129 |
| 2012/0242160 A1* | 9/2012 | Tseng | H04B 5/0037 |
| | | | 307/104 |
| 2012/0242284 A1* | 9/2012 | Wheatley, III | H02J 17/00 |
| | | | 320/108 |
| 2012/0295555 A1 | 11/2012 | Greene et al. | |
| 2013/0038136 A1* | 2/2013 | Wheatley | G06K 7/0008 |
| | | | 307/104 |
| 2013/0099585 A1* | 4/2013 | Von Novak | H01F 38/14 |
| | | | 307/104 |
| 2013/0207739 A1* | 8/2013 | Bakalski | H03H 7/40 |
| | | | 333/33 |
| 2013/0214610 A1* | 8/2013 | Tseng | H02J 7/025 |
| | | | 307/104 |
| 2013/0271184 A1 | 10/2013 | Gonzalez et al. | |
| 2013/0285659 A1 | 10/2013 | Sohn et al. | |
| 2014/0097791 A1* | 4/2014 | Lisuwandi | H01F 38/14 |
| | | | 320/108 |
| 2015/0023063 A1* | 1/2015 | Perreault | H02M 3/337 |
| | | | 363/17 |

* cited by examiner

METHOD AND APPARATUS FOR TUNING A RESISTANCE AND REACTANCE OF A WIRELESS POWER TRANSMITTER TESTING UNIT

FIELD

This application is generally related to testing of wireless power transmitters, and more specifically to methods and apparatuses for tuning a resistance and/or reactance of a wireless power transmitter testing unit.

BACKGROUND

Wireless power transmitters are configured to operate within specified parameters under a range of loading conditions. In order to ensure that the wireless power transmitters operate within the specified parameters, testing equipment may subject the transmitters to a plurality of loading conditions including various load impedances. To ensure the testing equipment is accurately recreating the desired load impedances, methods and apparatuses for tuning a resistance and reactance of a wireless power transmitter testing unit are desirable.

SUMMARY

According to some implementations, an apparatus for testing an impedance range of a wireless power transmitter is provided. The apparatus comprises an adjustable impedance circuit configurable to be connected to a power source. The apparatus comprises a transformer coupled to the adjustable impedance circuit. The apparatus comprises a sensing circuit configured to sense a parameter indicative of a parasitic impedance of the adjustable impedance circuit. The apparatus comprises a driver circuit configured to drive the transformer with a signal based on the sensed parameter that causes the transformer to apply a first voltage to the adjustable impedance circuit. The first voltage has a substantially same amplitude as a voltage drop caused by the parasitic impedance. The first voltage is out of phase with the voltage drop.

In some other implementations, a method for testing an impedance range of a wireless power transmitter is provided. The method comprises sensing a parameter indicative of a parasitic impedance of an adjustable impedance circuit configurable to be connected to a power source. The method further comprises driving a transformer coupled to the adjustable impedance circuit with a signal based on the sensed parameter that causes the transformer to apply a first voltage to the adjustable impedance circuit. The first voltage has a substantially same amplitude as a voltage drop caused by the parasitic impedance. The first voltage is out of phase with the voltage drop.

In yet other implementations, an apparatus for testing an impedance range of a wireless power transmitter is provided. The apparatus comprises means for providing an adjustable impedance to a power source. The apparatus comprises means for sensing a parameter indicative of a parasitic impedance of the means for providing the adjustable impedance. The apparatus comprises means for applying a first voltage to the means for providing the adjustable impedance based on the sensed parameter. The first voltage has a substantially same amplitude as a voltage drop caused by the parasitic impedance. The first voltage is out of phase with the voltage drop.

BRIEF DESCRIPTION OF THE DRAWINGS

The above-mentioned aspects, as well as other features, aspects, and advantages of the present technology will now be described in connection with various implementations, with reference to the accompanying drawings. The illustrated implementations, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION

In the following detailed description, reference is made to the accompanying drawings, which form a part of the present disclosure. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure.

Wireless power transfer may refer to transferring any form of energy associated with electric fields, magnetic fields, electromagnetic fields, or otherwise from a transmitter to a receiver without the use of physical electrical conductors (e.g., power may be transferred through free space). The power output into a wireless field (e.g., a magnetic field or an electromagnetic field) may be received, captured, or coupled by a "receive coupler" to achieve power transfer.

The terminology used herein is for the purpose of describing particular implementations only and is not intended to be limiting on the disclosure. It will be understood that if a specific number of a claim element is intended, such intent will be explicitly recited in the claim, and in the absence of such recitation, no such intent is present. For example, as used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Figure 1:
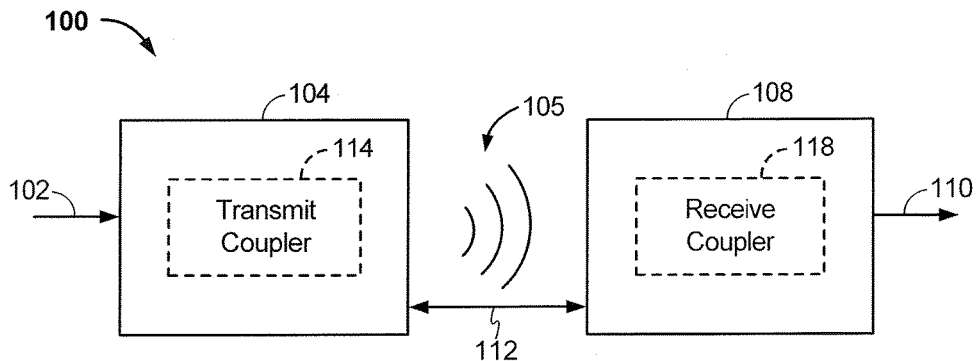
FIG. 1 is a functional block diagram of a wireless power transfer system, in accordance with some exemplary implementations.

FIG. 1 is a functional block diagram of a wireless power transfer system 100, in accordance with some exemplary implementations. Input power 102 may be provided to a transmitter 104 from a power source (not shown) to generate a wireless (e.g., magnetic or electromagnetic) field 105 via a transmit coupler 114 for performing energy transfer. The receiver 108 may receive power when the receiver 108 is located in the wireless field 105 produced by the transmitter 104. The wireless field 105 corresponds to a region where energy output by the transmitter 104 may be captured by the receiver 108. A receiver 108 may couple to the wireless field 105 and generate output power 110 for storing or consumption by a device (not shown in this figure) coupled to the output power 110. Both the transmitter 104 and the receiver 108 are separated by a distance 112.

In one example implementation, power is transferred inductively via a time-varying magnetic field generated by the transmit coupler 114. The transmitter 104 and the receiver 108 may further be configured according to a mutual resonant relationship. When the resonant frequency of the receiver 108 and the resonant frequency of the transmitter 104 are substantially the same or very close, transmission losses between the transmitter 104 and the receiver 108 are minimal. However, even when resonance between the transmitter 104 and receiver 108 are not matched, energy may be transferred, although the efficiency may be reduced. For example, the efficiency may be less when resonance is not matched. Transfer of energy occurs by coupling energy from the wireless field 105 of the transmit coupler 114 to the receive coupler 118, residing in the vicinity of the wireless field 105, rather than propagating the energy from the transmit coupler 114 into free space. Resonant inductive coupling techniques may thus allow for improved efficiency and power transfer over various distances and with a variety of inductive coupler configurations.

In some implementations, the wireless field 105 corresponds to the "near-field" of the transmitter 104. The near-field may correspond to a region in which there are strong reactive fields resulting from the currents and charges in the transmit coupler 114 that minimally radiate power away from the transmit coupler 114. The near-field may correspond to a region that is within about one wavelength (or a fraction thereof) of the transmit coupler 114. Efficient energy transfer may occur by coupling a large portion of the energy in the wireless field 105 to the receive coupler 118 rather than propagating most of the energy in an electromagnetic wave to the far field. When positioned within the wireless field 105, a "coupling mode" may be developed between the transmit coupler 114 and the receive coupler 118.

Figure 2:
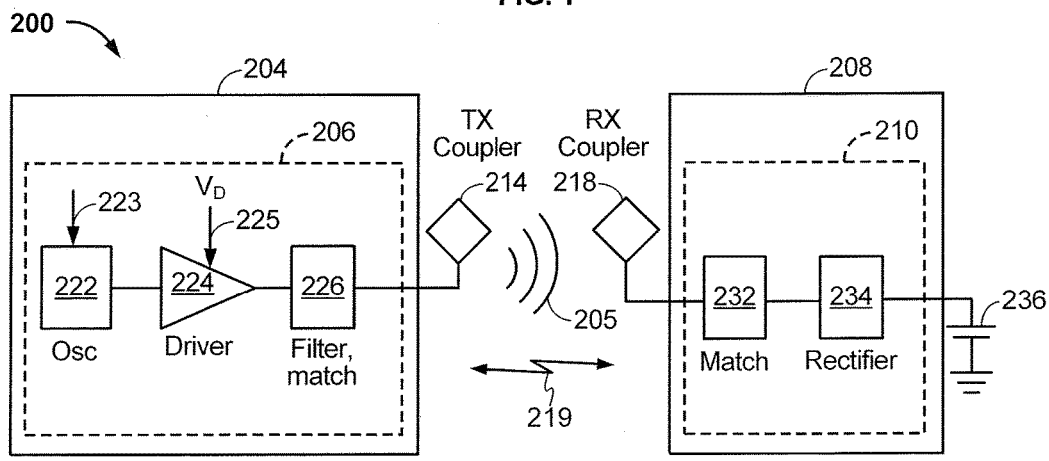
FIG. 2 is a functional block diagram of a wireless power transfer system, in accordance with some other exemplary implementations.

FIG. 2 is a functional block diagram of a wireless power transfer system 200, in accordance with some other exemplary implementations. The system 200 may be a wireless power transfer system of similar operation and functionality as the system 100 of FIG. 1. However, the system 200 provides additional details regarding the components of the wireless power transfer system 200 as compared to FIG. 1. The system 200 includes a transmitter 204 and a receiver 208. The transmitter 204 includes transmit circuitry 206 that includes an oscillator 222, a driver circuit 224, and a filter and matching circuit 226. The oscillator 222 may be configured to generate a signal at a desired frequency that may be adjusted in response to a frequency control signal 223. The oscillator 222 provides the oscillator signal to the driver circuit 224. The driver circuit 224 may be configured to drive the transmit coupler 214 at a resonant frequency of the transmit coupler 214 based on an input voltage signal ($V_D$) 225.

The filter and matching circuit 226 filters out harmonics or other unwanted frequencies and matches the impedance of the transmit circuitry 206 to the transmit coupler 214. As a result of driving the transmit coupler 214, the transmit coupler 214 generates a wireless field 205 to wirelessly output power at a level sufficient for charging a battery 236.

The receiver 208 comprises receive circuitry 210 that includes a matching circuit 232 and a rectifier circuit 234. The matching circuit 232 may match the impedance of the receive circuitry 210 to the impedance of the receive coupler 218. The rectifier circuit 234 may generate a direct current (DC) power output from an alternate current (AC) power input to charge the battery 236. The receiver 208 and the transmitter 204 may additionally communicate on a separate communication channel 219 (e.g., Bluetooth, Zigbee, cellular, etc.). The receiver 208 and the transmitter 204 may alternatively communicate via in-band signaling using characteristics of the wireless field 205. In some implementations, the receiver 208 may be configured to determine whether an amount of power transmitted by the transmitter 204 and received by the receiver 208 is appropriate for charging the battery 236.

Figure 3:
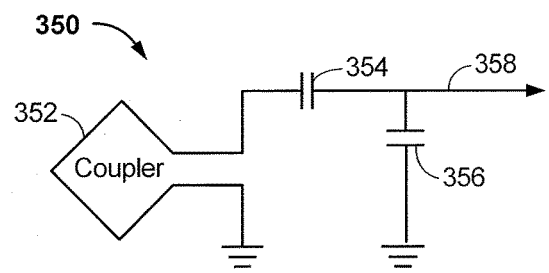
FIG. 3 is a schematic diagram of a portion of transmit circuitry or receive circuitry of FIG. 2 including a transmit or receive coupler, in accordance with some exemplary implementations.

FIG. 3 is a schematic diagram of a portion of the transmit circuitry 206 or the receive circuitry 210 of FIG. 2, in accordance with some exemplary implementations. As illustrated in FIG. 3, transmit or receive circuitry 350 may include a coupler 352. The coupler 352 may also be referred to or be configured as a "conductor loop", a coil, an inductor, or a "magnetic" coupler. The term "coupler" generally refers to a component that may wirelessly output or receive energy for coupling to another "coupler."

The resonant frequency of the loop or magnetic couplers is based on the inductance and capacitance of the loop or magnetic coupler. Inductance may be simply the inductance created by the coupler 352, whereas, capacitance may be added via a capacitor (or the self-capacitance of the coupler 352) to create a resonant structure at a desired resonant frequency. As a non-limiting example, a capacitor 354 and a capacitor 356 may be added to the transmit or receive circuitry 350 to create a resonant circuit that selects a signal 358 at a resonant frequency. For larger sized couplers using large diameter couplers exhibiting larger inductance, the value of capacitance needed to produce resonance may be lower. Furthermore, as the size of the coupler increases, coupling efficiency may increase. This is mainly true if the size of both transmit and receive couplers increase. For transmit couplers, the signal 358, with a frequency that substantially corresponds to the resonant frequency of the coupler 352, may be an input to the coupler 352.

In order to ensure that the wireless power transmitters, such as the transmitter 204, operate within the specified parameters, testing equipment may subject the transmitter 204 (e.g., at the output of the filter and matching circuit 226) to a plurality of loading conditions having various load impedances. However, in practice, parasitic impedances (e.g., a parasitic capacitance) between electrical components in such testing equipment may prevent the testing equipment from accurately presenting very low impedances to the wireless power transmitter 204 under test. For example, in some cases tuning such testing equipment for a desired impedance of 1.2Ω, for example, may cause the testing equipment to provide an actual impedance of approximately 5Ω due to these parasitic impedances. These parasitic impedances may cause a positive shift in parasitic real resistance as the parasitic reactance increases. Accordingly, the present application contemplates offsetting the parasitic impedances (e.g., the real resistances and/or the imaginary reactances) presented by the testing equipment components to substantially reduce or eliminate the effect of those parasitic impedances on the wireless power transmitter 204 under test. Example implementations may be described in more detail in connection with FIGS. 4 and 5 below.

Figure 4:
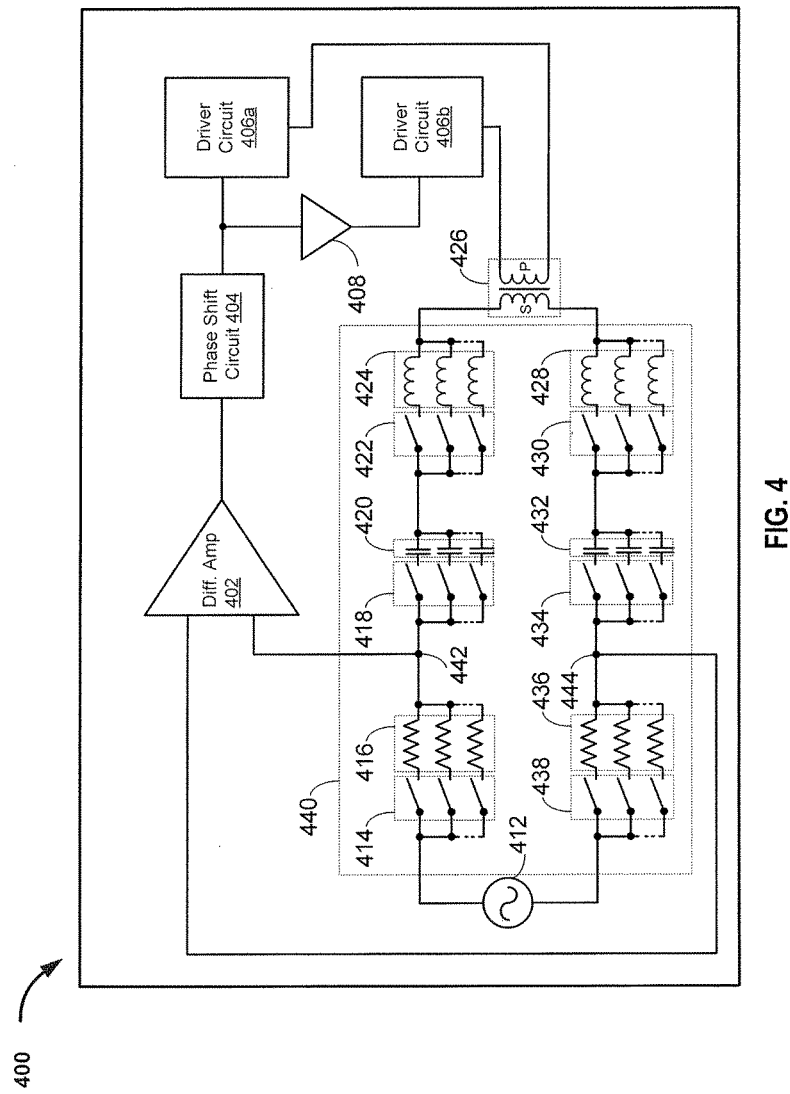
FIG. 4 shows a hybrid schematic/functional block diagram of an apparatus for testing an impedance range of a wireless power transmitter, in accordance with some exemplary implementations.

FIG. 4 shows a hybrid schematic/functional block diagram of an apparatus 400 for testing an impedance range of a wireless power transmitter 204, in accordance with some exemplary implementations. The apparatus 400 may comprise a loading test board configured to subject a wireless power transmitter 204, under test (not shown in FIG. 4), to a range of impedances for determining whether the wireless power transmitter 204 operates within desired parameters within that range of impedances. In some implementations, the apparatus 400 may be used to test a charging mat configured to simultaneously charge a number of different receiver devices. As each receiver device may present a different impedance to the transmit circuitry 206 in the mat based on its size, battery level, or other properties, it is desirable that the transmitter 204 within the mat be able to operate efficiently over a large range of impedances. This test apparatus 400 may be used to simulate this range of load impedances to ensure proper operation.

The apparatus 400 may comprise an adjustable power supply 412 electrically coupleable to, and configurable to drive, an adjustable impedance circuit 440. In some implementations, in order to test the wireless power transmitter 204 (FIG. 2), for example, an output of the transmit circuitry 206 may be connected as the adjustable power supply 412, in lieu of the transmit coupler 214.

The adjustable impedance circuit 440 may comprise a first bank of switches 414, each switch connected in series with a first terminal of the power supply 412 and connected to a respective one of a plurality of parallel-connected resistors in a first resistor bank 416. By closing one or more switches in the first bank of switches 414, corresponding resistors in the first resistor bank 416 may be switched into the path of the power supply 412. The adjustable impedance circuit 440 may additionally comprise a second bank of switches 418, each switch connected in series with the first resistor bank 416 and connected to a respective one of a plurality of parallel-connected capacitors in a first capacitor bank 420. By closing one or more switches in the second bank of switches 418, corresponding capacitors in the first capacitor bank 420 may be switched into the path of the power supply 412. The adjustable impedance circuit 440 may additionally comprise a third bank of switches 422, each switch connected in series with the first capacitor bank 420 and connected to a respective one of a plurality of parallel-connected inductors in a first inductor bank 424. By closing one or more switches in the third bank of switches 422, corresponding inductors in the first inductor bank 424 may be switched into the path of the power supply 412.

The adjustable impedance circuit 440 may further comprise a fourth bank of switches 438, each switch connected in series with a second terminal of the power supply 412 and connected to a respective one of a plurality of parallel-connected resistors in a second resistor bank 436. By closing one or more switches in the fourth bank of switches 438, corresponding resistors in the second resistor bank 436 may be switched into the path of the power supply 412. The adjustable impedance circuit 440 may additionally comprise a fifth bank of switches 434, each switch connected in series with the second resistor bank 436 and connected to a respective one of a plurality of parallel-connected capacitors in a second capacitor bank 432. By closing one or more switches in the fifth bank of switches 434, corresponding capacitors in the second capacitor bank 432 may be switched into the path of the power supply 412. The adjustable impedance circuit 440 may additionally comprise a sixth bank of switches 430, each switch connected in series with the second capacitor bank 432 and connected to a respective one of a plurality of parallel-connected inductors in a second inductor bank 428. By closing one or more switches in the sixth bank of switches 430, corresponding inductors in the second inductor bank 428 may be switched into the path of the power supply 412. By adjusting the switches in one or more of the first through sixth banks of switches 414, 418, 422, 438, 434, and 430, respectively, a range of impedances may be provided to a wireless power transmitter 204 under test (not shown). Although a particular arrangement of components (e.g., parallel-connected components) is shown in the adjustable impedance circuit 440, the present application is not so limited, and the adjustable impedance circuit 440 may have any arrangement (e.g., series connection, series-parallel connection, Pi and/or delta connections, the use of variable impedance components, or any combination thereof) such that each of a resistance, capacitance, and inductance may be independently tuned or adjusted.

However, parasitic impedances in the adjustable impedance circuit 440 (e.g., resistance and/or reactance of one or more of the resistors, capacitors, inductors or switches in the adjustable impedance circuit 440) may prevent the adjustable impedance circuit 440 from achieving very low impedances (e.g., approximately 1 ohm). In accordance with some implementations, in order to minimize, substantially eliminate, or compensate for these parasitic impedances, a transformer 426 is placed in series with, and at a balance point of, the adjustable impedance circuit 440. The transformer 426 is configured to apply a voltage equal to a voltage drop caused by the parasitic impedances (e.g., the real resistance of the parasitic impedances) in series with the adjustable impedance circuit 440. The balance point may be defined as a node within the adjustable impedance circuit 440 where a node voltage is substantially half of a voltage across the power supply 412 at any particular time (e.g., where a substantially equal impedance is located between the first terminal of the power supply 412 and the balance point and between the balance point and the second terminal of the power supply 412. As shown in FIG. 4, this may be a point in the adjustable impedance circuit 440 between the first and second inductor banks 424, 428, although the balance point may be at another location depending on the particular layout or design of the adjustable impedance circuit 440.

In FIG. 4, this parasitic impedance (e.g., real resistance) is determined, detected or measured utilizing a differential amplifier 402 having first and second terminals connected to the adjustable impedance circuit 440 before the first capacitor bank 420 and after the second capacitor bank 432, at nodes 442 and 444, respectively. The differential amplifier 402 measures a voltage drop across the predominantly reactive components of the adjustable impedance circuit 440 (e.g., the first and second capacitor banks 420, 432, the first and second inductor banks 424, 428, and the associated banks of switches 418, 422, 430, 438) and utilizes this measurement to determine the actual parasitic impedance when no voltage is impressed across the transformer 426, and the net effective parasitic impedance still remaining (e.g., to be attenuated or canceled) when a voltage is injected by the transformer 426 during fine tuning of the applied voltage.

In order to substantially cancel out the voltage drop caused by the parasitic impedance (e.g., the real resistance) of the predominantly reactive components of the adjustable impedance circuit 440, the voltage applied at the secondary coil (S) of the transformer 426 should have substantially the same magnitude as, and be substantially 180° out of phase with, the voltage measured across the differential amplifier 402 when no voltage is applied at the transformer 426 during loading. In this way, a root mean square (RMS) voltage drop of substantially zero may be achieved across the differential amplifier's 402 inputs, and so at the output of the differential amplifier 402, due to the parasitic resistances of the predominantly reactive components of the adjustable impedance circuit 440. Since there is substantially no effective RMS voltage drop across the predominantly reactive components it this condition, a wireless power transmitter 204 under test will be substantially unaffected by the actual parasitic resistances of the predominantly reactive components of the adjustable impedance circuit 440. Thus, the transformer 426 essentially applies, adds or presents a negative impedance (e.g., a negative real resistance) having a magnitude equal to the magnitude of the parasitic impedance (e.g., the real resistance) of the predominantly reactive components to the adjustable impedance circuit 440 during loading. In this way, the output of the differential amplifier 402 provides a feedback signal whose amplitude is proportional to the portion of the parasitic resistance of the predominantly reactive components of the adjustable impedance circuit 440 that has not been compensated for, or canceled out by, the added negative resistance at the transformer 426.

To ensure the phase shift is correctly tuned to achieve the above-stated outcome, the output of the differential amplifier 402 may be fed into a phase shift circuit 404. The phase shift circuit 404 is configured to adjust a phase of an output of the phase shift circuit 404 based on the output of the differential amplifier 402 (e.g., the phase is shifted until the output of the differential amplifier 402 has an amplitude of substantially zero). The phase adjusted output of the phase shift circuit 404 may be input to a first driver circuit 406a and to an inverter 408. The output of the inverter 408 may be fed into a second driver circuit 406b. The outputs of the first driver circuit 406a and the second driver circuit 406b form a differential drive amplifier configured to drive a voltage at the primary (P) coil of the transformer 426. In some implementations, the phase shift circuit 404 may be configured to adjust the phase of its output signal until the amplitude of the output of the differential amplifier 402 is substantially zero. This is because the voltage drop across the predominantly reactive components of the adjustable impedance circuit 440 (and so across the inputs of the differential amplifier 402) will be substantially zero when the voltage induced in the secondary (S) coil of the transformer 426 is equal in magnitude and 180° out of phase with the actual voltage drop across the reactive components caused by the parasitic impedances of the same. This may also be considered as when the negative resistance applied at the secondary coil of the transformer 426 has a substantially equal magnitude to that of the parasitic resistance of the substantially reactive components of the adjustable impedance circuit 440. In some other implementations, a differential driver amplifier setup may not be utilized. In these implementations, the first and second driver circuits 406a, 406b and the inverter 408 may be replaced with a single driver circuit (not shown) having its output terminals connected across the primary coil of the transformer 426.

Figure 5:
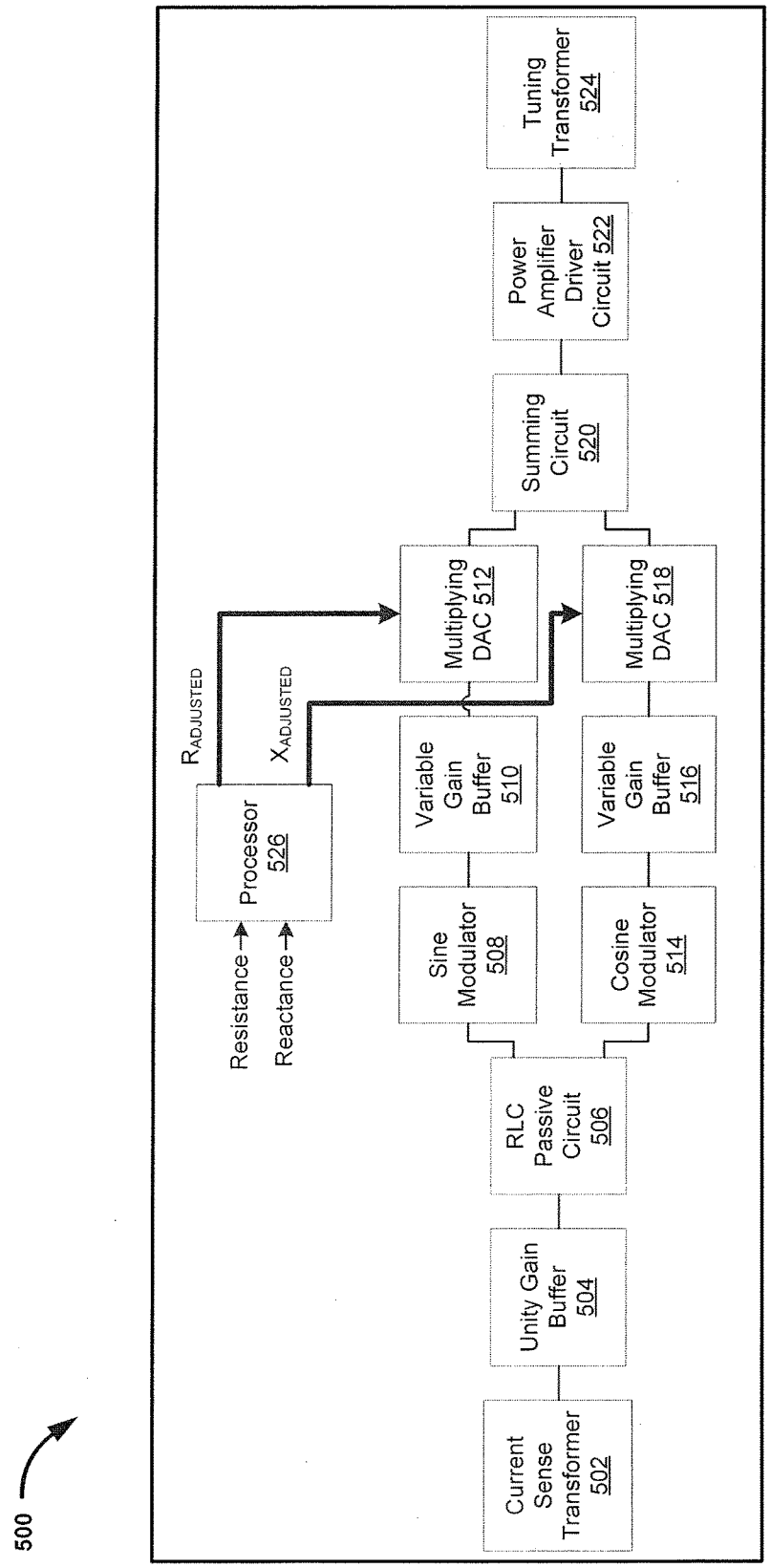
FIG. 5 shows another functional block diagram of an apparatus for testing an impedance range of a wireless power transmitter, in accordance with some other exemplary implementations.

FIG. 5 shows another functional block diagram of an apparatus 500 for testing an impedance range of a wirelessly power transmitter 204, in accordance with some other exemplary implementations. FIG. 5 may be a more general implementation of the concepts previously described in connection with FIG. 4. Thus, one or more components of the apparatus 500 in FIG. 5 may correspond to, or may substitute for, one or more components of the apparatus 400 in FIG. 4. In FIG. 5, the apparatus 500 comprises a current sense transformer 502, which may correspond to, or perform a similar function as, the differential amplifier 402 of FIG. 4. Instead of measuring a voltage drop across the adjustable impedance circuit 440 of FIG. 4, the current sense transformer 502 may be configured to sense a current proportional to a current passing through an adjustable impedance circuit (not shown but analogous to the circuit 440 of FIG. 4). Of course, the current sense transformer 502 may be replaced with any other module or circuit configured to sense the current circulating through, or the voltage appearing across at least a portion of the adjustable impedance circuit (not shown). The apparatus 500 further comprises a unity gain buffer 504 accepting the output of the current sense transformer 502 as an input. The unity gain buffer 504 provides impedance isolation between the current sense transformer 502 and the components that follow the unity gain buffer 504.

The apparatus 500 additionally comprises an RLC passive circuit 506, which may be configured to receive the output of the unity gain buffer 504 as an input and output a signal to each of a sine wave modulator 508 and a cosine wave modulator 514. The sine wave modulator 508 is configured to multiply the output of the RLC passive circuit 506 with a sine wave signal to output a modulated "in-phase" signal. Similarly, the cosine wave modulator 514 may be configured to multiply the output of the RLC passive circuit 506 with a cosine wave signal (e.g., a quadrature signal being 90° phase-shifted from the sine wave) to produce a modulated "quadrature-phase" signal. In some implementations, the output of the sine wave modulator 508 may be an analog signal that is proportional to or corresponds with a real resistance of at least the predominantly reactive components of the adjustable impedance circuit (not shown) of the apparatus 500. Likewise, the output of the cosine wave modulator 514 may be an analog signal that is proportional to or corresponds with an imaginary resistance (i.e., reactance) of at least the predominantly reactive components of the adjustable impedance circuit (not shown) of the apparatus 500. The apparatus 500 further comprises a first variable gain buffer 510 accepting the output of the sine wave modulator 508 as an input. The apparatus 500 further comprises a second variable gain buffer 516 accepting the output of the cosine wave modulator 514 as an input. The first and second variable gain buffers 510, 516 are configured to multiply their inputs by independently adjustable amplification factors and provide the multiplied inputs as outputs to first and second multiplying digital-to-analog converters (DACs) 512, 518. The first multiplying DAC 512 is configured to multiply a first input from the first variable gain buffer 510 with a real resistance adjustment control signal from a processor 526 and output a modulated "in-phase" signal. Likewise, the second multiplying DAC 518 is configured to multiply a first input from the second variable gain buffer 516 with a reactance adjustment control signal from the processor 526 and output a modulated "quadrature-phase" signal.

The processor 526 is configured to receive signals indicating actual determined or measured resistance and reactance values of the adjustable impedance circuit (not shown) of the apparatus 500 based on the current sensed by the current sense transformer 502. The processor 526 determines or calculates the appropriate values for the real resistance adjustment control signal and the reactance adjustment control signal required to reduce or eliminate the net or effective parasitic resistance of the predominantly reactive components of the adjustable impedance circuit (not shown) of the apparatus 500. The outputs of the first and second multiplying DACs 512, 518 (adjusted in-phase and quadrature-phase signals) are summed at a summing circuit 520, which outputs the summed signal to a power amplifier driver circuit 522. In some implementations, one or more of the RLC passive circuit 506, sine wave modulator 508, cosine wave modulator 514, first and second variable gain buffers 510, 516, first and second multiplying DACs 512, 518, processor 526 and summing circuit 520 may correspond to the phase shift circuit 404 of FIG. 4. For example, by adjusting the real resistance adjustment control signal and the reactance adjustment control signal, the magnitudes of the adjusted in-phase and quadrature-phase signals are modified such that, when summed at the summing circuit 520, the summed output signal is analogous to or substantially proportional to a phase-shifted and/or amplitude-adjusted version of the unity gain buffer 504 output (and so proportional to a phase-shifted (e.g., phase reversed) version of the current sensed by the current sense transformer 502).

The power amplifier driver circuit 522 receives the output from the summing circuit 520 and outputs a drive signal to a tuning transformer 524. The tuning transformer 524 may correspond to, and may be similarly connected to the adjustable impedance circuit (not shown) as, the transformer 426 of FIG. 4. In some implementations, the power amplifier driver circuit 522 may correspond to the first and second driver circuits 406a, 406b and the inverter 408 of FIG. 4.

The tuning transformer 524 may be configured to apply a voltage and/or current proportional to the voltage and/or current, respectively, of the drive signal input to the tuning transformer 524 back into the adjustable impedance circuit (not shown) of the apparatus 500 in order to substantially cancel out the actual parasitic impedance of the predominantly reactive components of the adjustable impedance circuit (not shown). In this way, the net or effective parasitic impedance (e.g., resistance) of the adjustable impedance circuit (not shown) may be maintained at a substantially zero value and the above-described difficulties of providing very low impedances (e.g., <1Ω) to a wireless power transmitter under test may be overcome.

Figure 6:
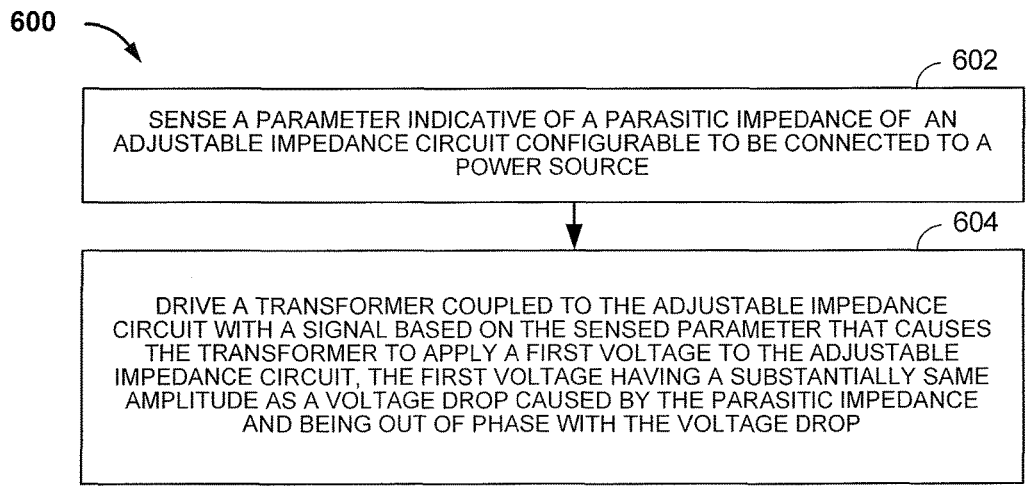
FIG. 6 is a flowchart depicting a method for testing an impedance range of a wireless power transmitter, in accordance with some exemplary implementations.

FIG. 6 is a flowchart 600 depicting a method for testing an impedance range of a wireless power transmitter, in accordance with some exemplary implementations. The flowchart 600 is described herein with reference to FIGS. 4 and 5. In an implementation, one or more of the blocks in flowchart 600 may be performed by a wireless power transmitter testing unit, such as the apparatus 400 or the apparatus 500 as shown in FIGS. 4 and 5, respectively. Although the flowchart 600 is described herein with reference to a particular order, in various implementations, blocks herein may be performed in a different order, or omitted, and additional blocks may be added.

At block 602, a parameter indicative of a parasitic impedance of an adjustable impedance circuit configurable to be connected to a power source is sensed. For example, as previously described in connection with FIG. 4, the differential amplifier 402 may sense a voltage drop across at least a portion of the adjustable impedance circuit 440 (e.g., across the predominantly reactive components of the adjustable impedance circuit 440). In other implementations, as previously described in connection with FIG. 5, the current sense transformer 502 may sense a current proportional to the current passing through the adjustable impedance circuit (not shown in FIG. 5).

At block 604, a transformer coupled to the adjustable impedance circuit is driven with a signal based on the sensed parameter that causes the transformer to apply a first voltage to the adjustable impedance circuit. The first voltage has a substantially same amplitude as a voltage drop caused by the parasitic impedance and is out of phase with the voltage drop. For example, as previously described in connection with FIG. 4, the driver circuits 406a, 406b may drive a signal to the primary (P) coil of the transformer 426, coupled to the adjustable impedance circuit 440, based on the voltage drop measured by the differential amplifier 402 (e.g., the sensed parameter). Applying the signal to the primary coil (P) of the transformer 426 may cause the secondary coil (S) of the transformer to apply a first voltage to the adjustable impedance circuit 440 having a substantially same amplitude as the sensed voltage drop and being 180° out of phase with the sensed voltage drop. In some other implementations, as previously described in connection with FIG. 5, the driver circuit 522 may apply a signal to the tuning transformer 524 based on the current sensed by the current sense transformer 502 that causes the tuning transformer 524 to apply a first voltage into the adjustable impedance circuit 440 having a substantially same amplitude as a voltage drop across the predominantly reactive components of the adjustable impedance circuit and being 180° out of phase with that voltage drop.

Figure 7:
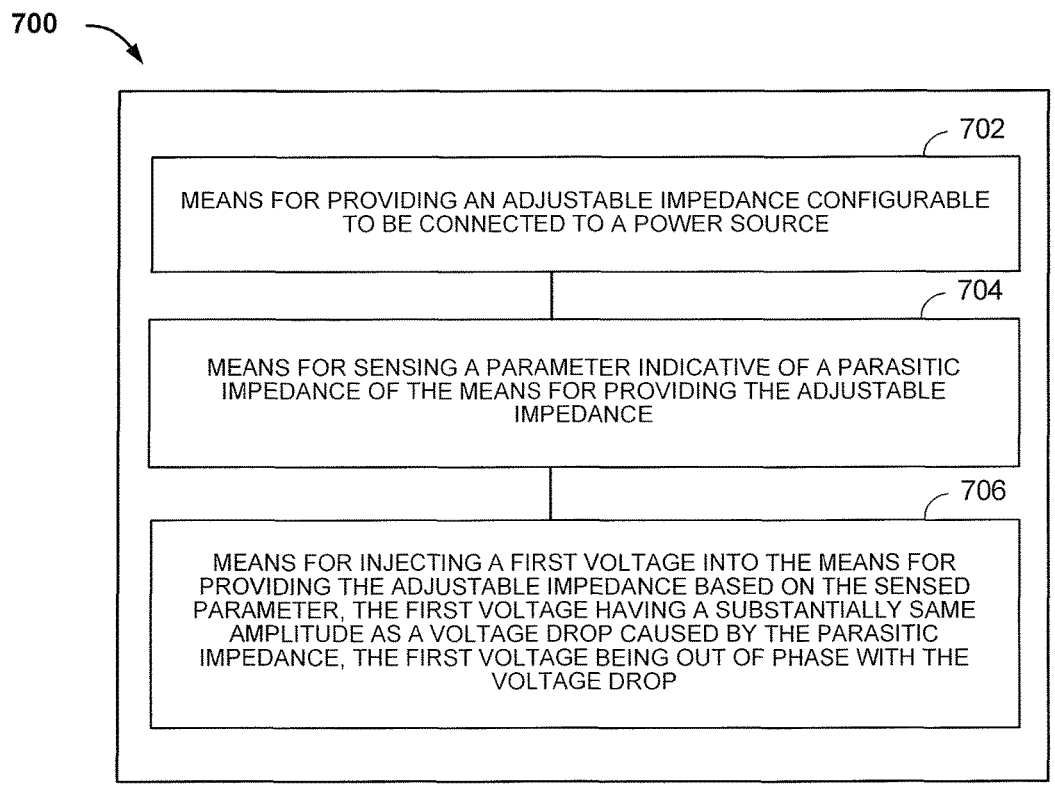
FIG. 7 is a functional block diagram of an apparatus for testing an impedance range of a wireless power transmitter, in accordance with some other exemplary implementations.

FIG. 7 is a functional block diagram of an apparatus 700 for testing an impedance range of a wireless power transmitter, in accordance with some exemplary implementations. The apparatus 700 may be configured to perform one or more operations as previously described in connection with FIG. 6. The apparatus 700 includes means 702 for providing an adjustable impedance to a power source. In some implementations, the means 702 may comprise the adjustable impedance circuit 440 of FIG. 4, or the adjustable impedance circuit (not shown) as previously described in connection with FIG. 5.

The apparatus 700 further includes means 704 for sensing a parameter indicative of a parasitic impedance of the means for providing the adjustable impedance. In some implementations, the means 704 may be configured to perform the operation of operation block 602 previously described in connection with FIG. 6. In some implementations, means 704 may comprise the differential amplifier 402 of FIG. 4, or alternatively, the current sense transformer 502 of FIG. 5.

The apparatus 700 further includes means 706 for means for applying a first voltage to the means 702 for providing the adjustable impedance based on the sensed parameter. The first voltage has a substantially same amplitude as a voltage drop caused by the parasitic impedance. The first voltage is out of phase with the voltage drop. In some implementations, the means 706 may be configured to perform the operation of operation block 604 previously described in connection with FIG. 6. In some implementations, means 706 may comprise one or more of the differential amplifier 402, the phase shift circuit 404, the driver circuits 406a, 406b, the inverter 408, and the transformer 426, as previously described in connection with FIG. 4. In some other implementations, the means 706 may comprise one or more of the modules 502-526, as previously described in connection with FIG. 5.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality may be implemented in varying ways for each particular application, but such implementation decisions should not be interpreted as causing a departure from the scope of the implementations.

The various illustrative blocks, modules, and circuits described in connection with the implementations disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the implementations disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium may be integral to the processor. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer readable media. The processor and the storage medium may reside in an ASIC.

For purposes of summarizing the disclosure, certain aspects, advantages and novel features have been described herein. It is to be understood that not necessarily all such advantages may be achieved in accordance with any particular implementation. Thus, one or more implementations achieves or optimizes one advantage or group of advantages as taught herein without necessarily achieving other advantages as may be taught or suggested herein.

Various modifications of the above described implementations will be readily apparent, and the generic principles defined herein may be applied to other implementations without departing from the spirit or scope of the application. Thus, the present application is not intended to be limited to the implementations shown herein but is to be accorded the widest scope consistent with the principles and novel features disclosed herein.

What is claimed is:

1. An apparatus for testing an impedance range of a wireless power transmitter, comprising:
    an adjustable impedance circuit configurable to be connected to a power source;
    a transformer coupled to the adjustable impedance circuit;
    a sensing circuit configured to sense a parameter indicative of a parasitic impedance of the adjustable impedance circuit; and
    a driver circuit configured to drive the transformer with a signal based on the sensed parameter that causes the transformer to apply a first voltage to the adjustable impedance circuit, the first voltage having a substantially same amplitude as a voltage drop caused by the parasitic impedance and being out of phase with the voltage drop.

2. The apparatus of claim 1, wherein the sensed parameter is at least one of a current circulating in the adjustable impedance circuit or a voltage across at least a portion of the adjustable impedance circuit.

3. The apparatus of claim 1, wherein the parasitic impedance has a parasitic resistance, and wherein the transformer is configured to add a negative resistance to the adjustable impedance circuit by applying the first voltage to the adjustable impedance circuit, the negative resistance being substantially equal in magnitude to the parasitic resistance.

4. The apparatus of claim 1, wherein the transformer is coupled to a balance point of the adjustable impedance circuit.

5. The apparatus of claim 4, wherein the balance point comprises a node within the adjustable impedance circuit where a node voltage is substantially half of a voltage across the power supply.

6. The apparatus of claim 1, further comprising a phase-shift circuit configured to shift a phase of the sensed parameter and provide the phase-shifted sensed parameter to the driver circuit.

7. The apparatus of claim 6, wherein the phase-shift circuit is configured to shift the phase of the sensed parameter until the first voltage injected into the adjustable impedance circuit is 180° out of phase with the voltage drop.

8. The apparatus of claim 1, wherein the sensing circuit comprises at least one of a current sense transformer or a differential amplifier.

9. The apparatus of claim 1, wherein the adjustable impedance circuit is configurable to present an adjustable impedance to a wireless power transmit circuit of the wireless power transmitter.

10. A method for testing an impedance range of a wireless power transmitter, comprising:
sensing a parameter indicative of a parasitic impedance of an adjustable impedance circuit configurable to be connected to a power source, and
driving a transformer coupled to the adjustable impedance circuit with a signal based on the sensed parameter that causes the transformer to apply a first voltage to the adjustable impedance circuit, the first voltage having a substantially same amplitude as a voltage drop caused by the parasitic impedance and being out of phase with the voltage drop.

11. The method of claim 10, wherein the sensed parameter is at least one of a current circulating in the adjustable impedance circuit or a voltage across at least a portion of the adjustable impedance circuit.

12. The method of claim 10, wherein the parasitic impedance has a parasitic resistance and the method further comprises providing a negative resistance to the adjustable impedance circuit by applying the first voltage to the adjustable impedance circuit, the negative resistance being substantially equal in magnitude to the parasitic resistance.

13. The method of claim 12, wherein the first voltage is applied to a balance point of the adjustable impedance circuit, the balance point having node voltage that is substantially half of a voltage across the power supply.

14. The method of claim 10, further comprising shifting a phase of the sensed parameter and providing the phase-shifted sensed parameter to a driver circuit for driving the transformer.

15. The method of claim 14, further comprising shifting the phase of the sensed parameter until the first voltage applied to the adjustable impedance circuit is 180° out of phase with the voltage drop.

16. The method of claim 10, further comprising presenting an adjustable impedance to a wireless power transmit circuit of the wireless power transmitter.

17. An apparatus for testing an impedance range of a wireless power transmitter, comprising:
means for providing an adjustable impedance to a power source;
means for sensing a parameter indicative of a parasitic impedance of the means for providing the adjustable impedance; and
means for applying a first voltage to the means for providing the adjustable impedance based on the sensed parameter, the first voltage having a substantially same amplitude as a voltage drop caused by the parasitic impedance and being out of phase with the voltage drop.

18. The apparatus of claim 17, wherein the parasitic impedance has a parasitic resistance, the apparatus further comprising means for adding a negative resistance to the means for providing the adjustable impedance by applying the first voltage to the means for providing the adjustable impedance, the negative resistance being substantially equal in magnitude to the parasitic resistance.

19. The apparatus of claim 17, further comprising means for shifting a phase of the sensed parameter and providing the phase-shifted sensed parameter to the means for applying the first voltage to the means for providing the adjustable impedance.

20. The apparatus of claim 19, wherein the means for shifting the phase of the sensed parameter is configured to shift the phase of the sensed parameter until the first voltage is 180° out of phase with the voltage drop.

* * * * *